United States Patent [19]

Shannon et al.

[11] Patent Number: 5,299,222
[45] Date of Patent: Mar. 29, 1994

[54] MULTIPLE DIODE LASER STACK FOR PUMPING A SOLID-STATE LASER

[75] Inventors: David Shannon, Sunnyvale; Richard Wallace, Los Altos Hills, both of Calif.

[73] Assignee: Lightwave Electronics, Mountain View, Calif.

[21] Appl. No.: 849,667

[22] Filed: Mar. 11, 1992

[51] Int. Cl.⁵ ............................................. H01S 3/094
[52] U.S. Cl. .................................... 372/75; 385/31; 385/33; 385/34
[58] Field of Search ............... 372/75, 69, 70, 71; 385/31, 33, 34

[56] References Cited

U.S. PATENT DOCUMENTS

| | | | |
|---|---|---|---|
| 3,736,518 | 5/1973 | Anderson et al. | 330/4 |
| 4,383,318 | 5/1983 | Barry et al. | 372/6 |
| 4,710,940 | 12/1987 | Sipes | 372/75 |
| 4,785,459 | 11/1988 | Baer | 372/75 |
| 5,022,043 | 6/1991 | Jacobs | 372/75 |
| 5,077,750 | 12/1991 | Pocholle et al. | 372/75 |
| 5,185,758 | 2/1993 | Fan et al. | 372/75 |

OTHER PUBLICATIONS

T. Y. Fan et al, Optics Letters, vol. 14, No. 19, Oct. 1, 1989, pp. 1057–1059.
T. Y. Fan et al, I.E.E.E. Jour. of Quantum Electronics, vol. 26, No. 2, Feb. 1990 pp. 311–316.

Primary Examiner—James W. Davie
Attorney, Agent, or Firm—John Schipper

[57] ABSTRACT

Apparatus for end-pumping of a solid-state laser with a source of high optical brightness. A stack of diode laser bars are excited, and each bar emits a light beam of a selected pump wavelength in a chosen direction. The light beam output of the diode bar stack is divided into a plurality of smaller, approximately rectangular light beams, which serve as extended light sources, by a plurality of mirrors that are positioned to receive one or more of these smaller beams and redirect such beams onto first, light-receiving ends of one or more optical fibers. Light collection optics receive the beams issuing from the mirrors and focus these beams onto a light-receiving end of an optical fiber with beam convergence angles that are appropriate for the numerical aperture of that fiber. Second ends of the optical fibers are optionally positioned so that a light beam emitted from the second end of a fiber is received by a laser gain material in a laser cavity and propagates along a common optical path within the laser cavity, thereby pumping the laser gain material.

24 Claims, 4 Drawing Sheets

MULTIPLE DIODE LASER STACK FOR PUMPING A SOLID-STATE LASER

This work was performed under Contract NAS-5-31387 with the Goddard Flight Center for the National Aeronautics and Space Administration. The United States Government has certain rights in this invention.

FIELD OF THE INVENTION

This invention relates to an optical system for collection of diode laser light emitted from a stack of diode laser bars into optical fibers at high brightness, for use in pumping solid-state lasers.

BACKGROUND OF THE INVENTION

End-pumped lasers offer many advantages over side-pumped lasers in efficiency and beam quality. This is true if all of the pump energy can be imaged inside the fundamental mode radius of the solid-state laser, and if the gain medium is long enough to absorb a large fraction of the pump light.

The evolution of diode lasers to higher output powers has been from an array of single strip diodes or extended emitter diode lasers, to a bar of multiple arrays, and then to a stack of bars. Examples of diode laser arrays are Spectra Diode Labs Models SDL-2460 and SDL-2480, or Sony Models SLD 301, 302, 303 and 304. The emission pattern separation of these arrays is less than a few microns in the direction perpendicular to the diode junction. In the direction parallel to the diode junction, the pattern length is almost one millimeter for the higher power diode arrays. Because of thermal load requirements, the next step to higher power is presently implemented by use of a diode laser bar of many arrays. The Spectra Diode Labs Models SDL-3490 and 3450 are examples of 10-Watt and 15-Watt laser diode bars. These bars still emit from a few micron source perpendicular to the plane of the junction, but for the other plane the length is typically 10 mm. The number of arrays in these bars is typically between 10 and 35.

For even higher laser output power, the diode bars can be stacked into two-dimensional arrays. The model SDL-3230-TZS units are bars stacked on 0.4 mm center-to-center spacing. These stacked bars are rated only for quasi-cw operation due to thermal constraints, but they are rated for 60 Watts of power per bar at a few percent duty cycle.

T. Y. Fan et al, in "Scalable, End-Pumped, Diode-Laser-Pumped Laser," Optics Letters, Vol. 14 (1989) pp. 1057–1059, and in "Pump Source Requirements for End-pumped Lasers", I.E.E.E. Jour. Quant. Electr., vol. 26 (1990) pp. 311–316, describe a technique for scaling of end-pumped lasers using diode laser arrays. The light beam from each diode laser is collimated in two perpendicular directions by two consecutive cylindrical lenses to produce a light beam with parallel edges. This light beam is then focused by a lens on an end of an optical fiber with a large numerical aperture (NA$\geq$0.47) to pump a laser gain medium.

Anderson et al disclose use of a cylindrical lens to collimate light issuing from a diode laser to produce a light beam with parallel beam edges, in U.S. Pat. No. 3,736,518.

Barry et al, in U.S. Pat. No. 4,383,318, disclose capture of light issuing from a plurality of diode lasers by a plurality of optical fibers positioned at faces of the diode lasers. These optical fibers are then caused to coalesce into a single optical fiber, which delivers the diode laser light captured therein for side pumping of a laser gain medium. No optics are disclosed for capture or control of the light beams emitted by the diode lasers.

U.S. Pat. No. 4,710,940, issued to Sipes, discloses use of an optical cavity with multiple light beam bounce points along two transparent parallel edges of the cavity. Individual laser diode arrays are positioned to direct diode laser light beams at the bounce points. No optics are disclosed for capture or control of the light beams emitted by the diode lasers.

Baer, in U.S. Pat. No. 4,785,459, discloses use of a zig-zag cavity resonator with a diode laser pump positioned at each bounce point of the zig-zag optical path in the resonator. Each diode laser is either butted against a side of the resonator or is passed transversely through an optical fiber (shown most clearly in FIGS. 3A-3E of the Baer patent) to collimate the diode laser light and produce a light beam with parallel beam edges in a first direction. The resulting light beam is delivered to a laser gain medium within the resonator.

What is needed is an approach that collects and concentrates laser output from a stack of diode laser bars in a form that is useful and flexible for pumping of a laser. Preferably, the approach should take account of the difference in beam divergence angles for light emitted by a diode laser in two perpendicular directions.

SUMMARY OF THE INVENTION

These needs are met by the invention, which in one embodiment provides a method for coupling the output light beams from a stack of diode laser bars for side-pumping of a solid state laser cavity. Light emitted by a diode laser bar has a beam divergence angle in a first direction that is much larger than a beam divergence angle in a second, perpendicular direction. Light from selected groups of diode laser bars is collected by one of a plurality of cylindrical lenses that reduces the beam divergence angle in the first direction to approximately the beam divergence angle in the second direction. The beam divergence angle in the second direction is not altered by the cylindrical lens. Light issued from the cylindrical lenses is then divided into a plurality of smaller, approximately rectangular or square beams that are reflected in different directions. This reflected light is then received by light collection optics that focuses this light on the end of one of a plurality of adjacent optical fibers, with a beam convergence angle whose sine is no greater than the numerical aperture NA of the fiber.

The optical fibers may be used as pump sources for a diode laser-pumped solid-state laser. The individual fibers or groups of fibers are imaged into the fundamental laser mode volume of the solid-state laser at various light beam bounce points in the laser crystal. The solid-state laser optical cavity has two or more planar faces, each of which receives and reflects, at a light bounce point, a light beam propagating within the cavity to define an optical path within the cavity. A light emitting end of each fiber is positioned adjacent to a light bounce point on a reflecting face of the optical cavity and is oriented so that light that issues from the adjacent fiber is received and refracted by the cavity material along the optical path of the light beam propagating within the cavity.

DETAILED DESCRIPTION OF THE PREFERRED EMBODIMENT

Figure 1:
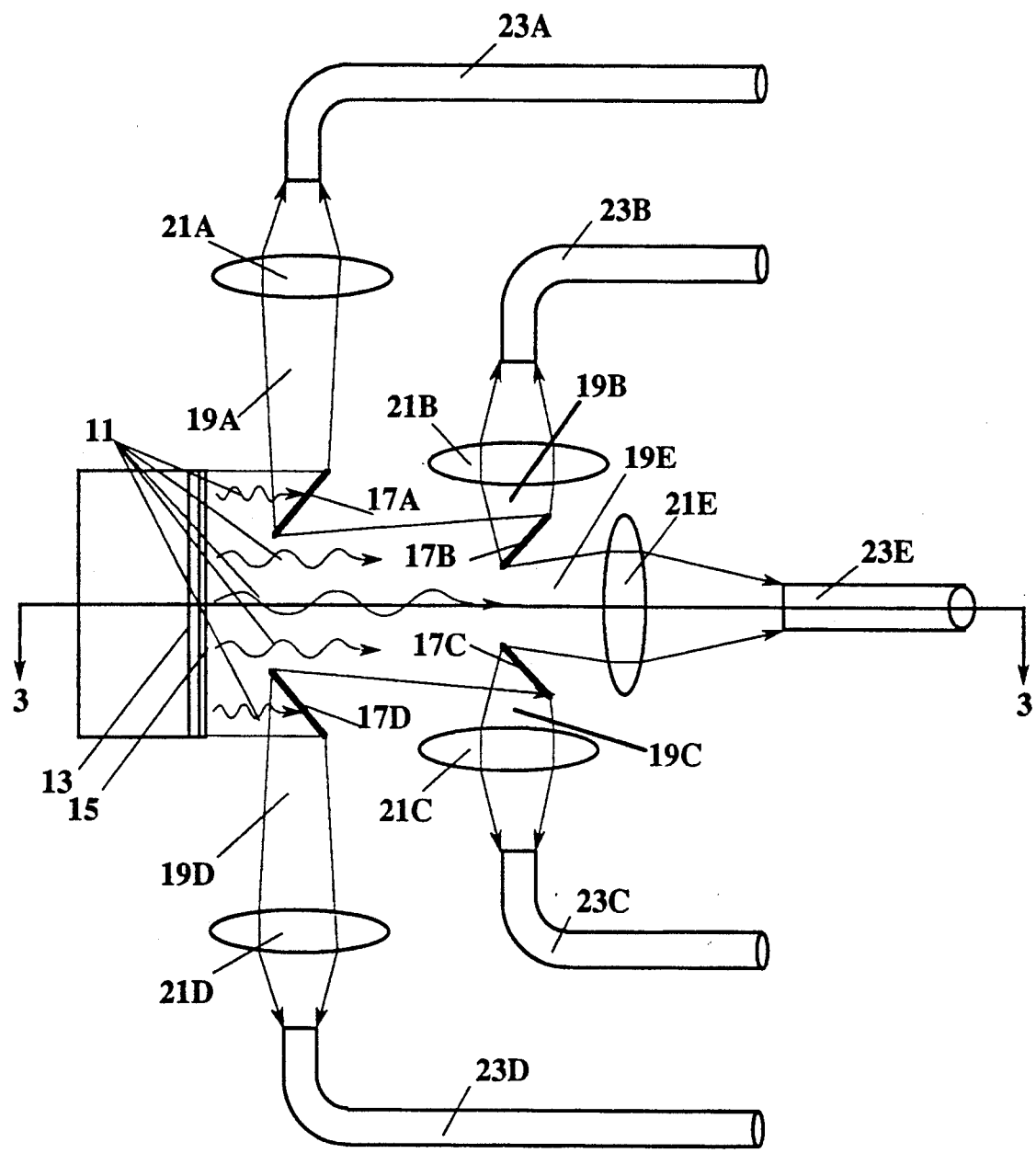
FIGS. 1 and 2 are schematic views of an optical system used to couple a 1-cm length diode laser stack into five separate fibers.

In one embodiment, shown schematically in FIG. 1, the light beam output of stacked diode laser bars is coupled into a plurality of optical fibers. The output light beams from the fibers may be used to pump a laser resonator. The fibers can be grouped at various end points of a solid-state laser cavity for efficient end-pumping. In FIG. 1, a light beam 11 is emitted by a plurality of diode laser bars in a diode laser bar stack 13, and light from a selected group of the bars is collected by one of a plurality of cylindrical lenses 15 positioned adjacent to but spaced apart from each diode bar in the stack 13. Each diode laser bar may have an aspect ratio (length-to-width) as high as 10,000:1, or even higher, and the cylindrical lenses 15 are interposed to reduce the beam divergence angle in a first direction, relative to the beam divergence angle in a second, perpendicular direction, so that the resulting beam divergence angle in each of the two directions is roughly the same. A diode bar stack 13 typically has a length of one cm and a width of 2 mm and may include a plurality of diode bars, for example, the five diode bars shown in FIGS. 3 and 4. One such diode laser system is the SDL-TZS diode laser system, available from Spectra Diode Laboratories.

A plurality of two or more turning mirrors 17A, 17B, 17C and 17D separate mutually exclusive portions of the light beam 11 into non-overlapping light beam components 19A, 19B, 19C and 19D, respectively, and one or more pump light beam components, such as 19E, is optionally defined by a portion of the light beam 11 that does not encounter a turning mirror. Each light beam component 19A, 19B, 19C, 19D and 19E is then focussed by suitable focusing optics 21A, 21B, 21C, 21D and 21E, respectively, into a corresponding multimode optical fiber 23A, 23B, 23C, 23D and 23E, respectively, with the diameters of the fibers being chosen to fully capture the optical beam intended for that fiber. Preferably, the sine of the convergence angle as a light beam arrives at a light-receiving end of a fiber is less than the numerical aperture NA of that fiber. In one embodiment, each optical fiber has a diameter of about 500 $\mu$m, but this fiber diameter may be as large as a few mm. Each of the focusing optics $21j$ (j=A, B, C, D or E) may be a lens with a short focal length, such as f=6.35 mm, and is intended to cause the resulting beam to converge to an entrance diameter, measured at the entrance of the corresponding fiber $23j$, that is about 25 percent of the diameter of the portion of the pump light beam 11 that arrives at the focusing optics $21j$.

Each of the turning mirrors 17A, 17B, 17C and 17D captures an optical beam that has its source in one of the diode laser sub-assemblies 13A, 13B, 13C and 13D (FIG. 4), respectively. Optionally, an optical beam that has its source in the diode laser assembly 13E is captured directly by the imaging optics 21E in FIG. 1. The turning mirrors $17j$ (j=A, B, C, D) are positioned so that these mirrors collectively capture substantially all portions $19j$ of the light beam issued by a diode laser stack, except for one or more optional pump beam components 19E discussed above. Each of these sub-assemblies $13j$ (FIG. 4) is preferably approximately rectangular or square but may have another convenient shape.

The numerical aperture NA of the multimode fiber $23j$ preferably lies in the range 0.15–0.3 but may be as high as 0.5, or even higher. Each optical fiber $23j$ delivers the component pump light beam propagating therein to a selected position and with a selected angular orientation relative to the laser cavity to be pumped by this collection of component pump light beams, as illustrated in more detail in FIGS. 5, 6 and 7, discussed below. Each optical fiber $23j$ is preferably provided with an anti-reflective coating at the diode laser wavelength $\lambda_P$, and the coating is either applied directly to the fiber end or to a separate glass window that is bonded to the light-receiving end of that fiber. The core material of the fiber $23j$ may be glass, and the cladding material of the fiber may be glass or plastic, with a smaller refractive index than the core refractive index, determined in part by the numerical aperture of the fiber in a manner well known in the art.

In a typical high powered, broad area diode laser or multi-strip diode laser array, the output beam is not symmetric about a central axis. In a plane oriented perpendicular to the semiconductor junction, the beam is highly divergent but is almost diffraction-limited, with a typical half-angle of divergence of about 20°–25°. In a plane oriented parallel to the junction, the beam angle may be tens to thousands of times as large as the diffraction limit, typically diverging at a 5° half-angle regardless of the length of an array, or of a bar of an array. When the diode laser bars are stacked one above another, the diffraction-limited directions coincide with the stacking direction. The number N of diode bars that make up the array may be any number $N \geq 2$, but N=5 is chosen here for illustration.

Figure 2:
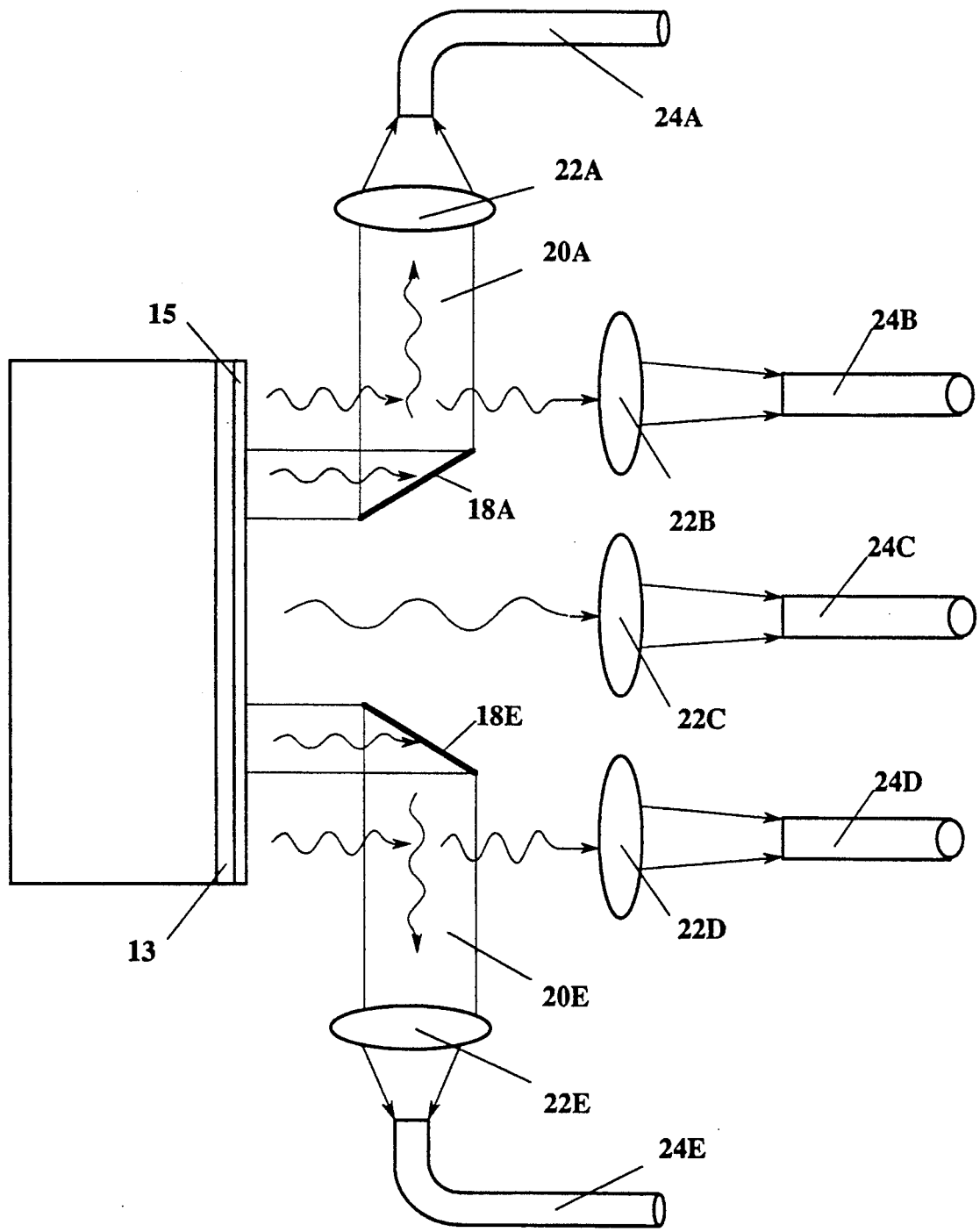

FIG. 2 schematically illustrates another configuration, in which portions of light from a diode laser stack 13 are passed through one of a plurality of cylindrical lenses 15 are divided into light beams 20A and 20E, which are received and redirected by turning mirrors 18A and 18E, and light beams 20B, 20C and 20D that are not received by any turning mirror. The resulting light beams 20A, 20B, 20C, 20D and 20E are then received by light collection optics 22A, 22B, 22C, 22D and 22E, respectively, that focus these light beams onto light-receiving ends of optical fibers 24A, 24B, 24C, 24D and 24E, respectively.

Figure 3:
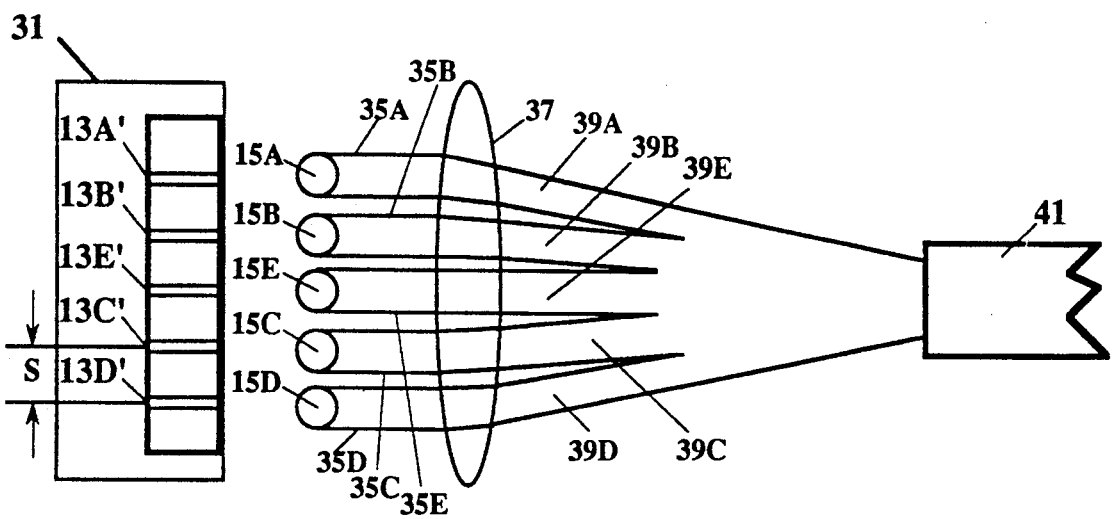
FIG. 3 is a sectional side view, along the line 3—3 of FIG. 1, of a five-bar diode array stack, illustrating how the bars output in one section is re-imaged into an optical fiber.

FIG. 3 illustrates a typical five-bar diode laser array or stack 31 in a sectional side view, taken along the line 3—3 of FIG. 1. Many small diameter cylindrical lenses $15j$ (j=A, B, C, D and E; shown as 15 in the top view of FIG. 1) are placed directly in front of the respective diode bars 13A', 13B', 13C', 13D' and 13E' (shown as 13 in the top view of FIG. 1). These cylindrical lenses collect the rapidly diverging, but diffraction-limited, light beams in a first direction before the beams expand and overlap appreciably in that direction, and these lenses transform the beams into sheets of light $35j$ that are mildly divergent in the first direction. Divergence of these beams in a second, perpendicular direction is not appreciably altered by the cylindrical lenses 15A, 15B, 15C, 15D and 15E. The spacing between adjacent bars $13j'$ in the diode array stacking in one embodiment is $s=0.4$ mm, and there is sufficient room to place 0.2 mm width cylindrical lenses $15j$, one above another, in front of the diode bar components. The cylindrical lenses $15j$ may be round fused silica rods. A focussing lens or light collection optics 37 is positioned to receive and focus a selected portion of these sheets $35j$ of light into converging sheets $39j$ (running perpendicular to the plane of the page in FIG. 3) received by one or more optical fibers 41 of diameter a few mm or less.

Figure 4:
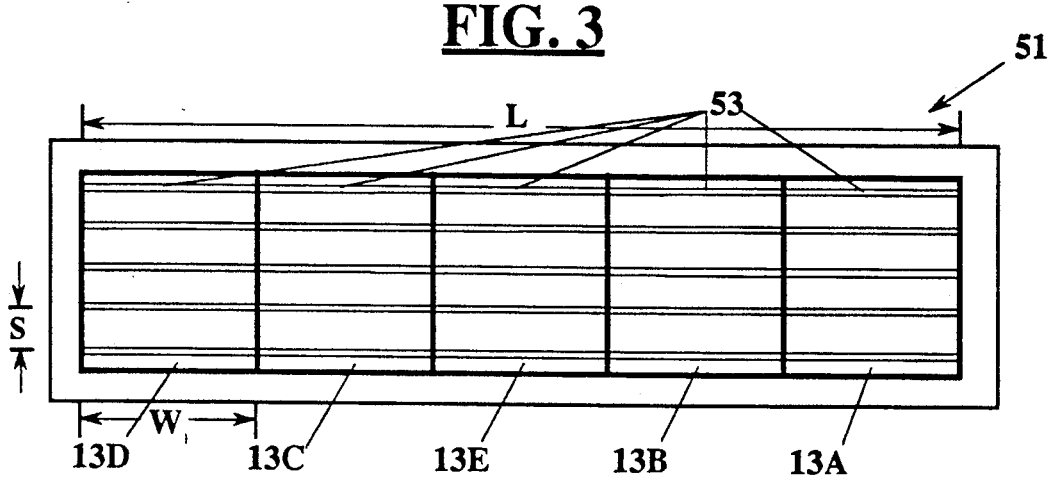
FIG. 4 is a front view of a five-bar diode array stack, illustrating the division of the emitting area into five sections that are separately coupled into a plurality of optical fibers.

Viewed in the other direction in this embodiment, each light beam sheet $35j$ has a length $L=10$ mm at the facet, and diverges with a half-angle of about $5°$. A single optical fiber is difficult to focus into from this direction. However, by dividing the beam in this dimension into a plurality of manageable subsections or blocks of light 53, as shown in FIG. 4, each subsection can be coupled efficiently into a separate optical fiber. In FIG. 4, the length L of a diode stack 51 is divided into five sections, each being $w=2$ mm long. Each of these sections can then be focussed down to a 1 mm diameter spot having a numerical aperture $NA \approx 0.2$. This low NA output provides high beam brightness. If the length L of the bars is divided into fewer than five sections, for example, three, then each 3.3-mm long section would have an $NA \approx 0.3$, when focussed to a 1-mm diameter spot. This higher NA may be quite useful for many applications, and it does reduce expense by using fewer components.

The diode laser bar stack output is easily broken up into these separate sections, using turning mirrors $17j$ shown in FIG. 1 that may be simple microscope cover slides coated to act as highly reflective mirrors for a 45-degree incidence angle at the pump light wavelength $\lambda_P$ produced by the diode lasers. The fiber coupling arrangement can be optimized to attain the best compromise between coupling efficiency, fiber diameter and fiber output.

Figure 5:
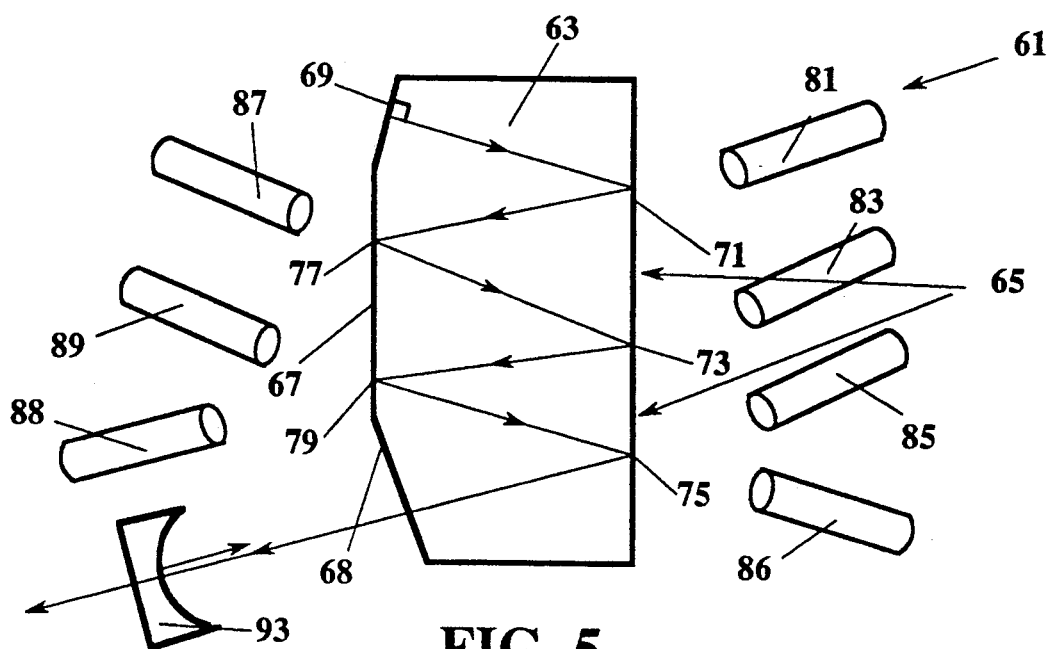
FIGS. 5 and 6 illustrate several bounce point locations in representative solid-state laser cavities that can be used for end-pumping of a cavity according to the invention.

FIG. 5 shows one possible configuration of a solid-state laser cavity 61 and laser gain medium 63 that has at least two planar, light reflecting surfaces 65 and 67 and a plurality of light beam bounce points 71, 73, 75, 77 and 79 at these surfaces that can receive a light beam from one of the optical fibers 81, 83, 85, 87 and 89, respectively, of the system. The number of light beam bounce points for the laser gain medium 63 may be any number greater than one. Material for the solid-state laser gain material 63 can be Nd:YAG, Tm:YAG or Nd:YLF, with the surfaces 65 and 67 oriented to form a zig-zag optical path for a laser beam 91 propagating within the laser gain medium 63. The surfaces 65 and 67 have dichroic optical coatings thereon that are highly reflecting at the solid-state laser wavelength $\lambda_L$ to be produced, for example, $\lambda_L = 1.064$ μm, and are highly transmissive at the pumping wavelength $\lambda_P$, for example, $\lambda_P = 0.808$ μm. A re-entrant surface 68 of the laser gain medium 63 has an anti-reflection coating for incident light having the laser wavelength $\lambda_L$. Another surface 69 of the gain medium 63 is oriented perpendicular to the direction of the incident laser beam 89 and has a coating thereon that is highly reflecting at the laser wavelength $\lambda_L$. Two or more planar, light reflecting surfaces, such as 65 and 67, may be provided, and these surfaces need not be parallel to one another.

The optical cavity 61 is completed by an optical output coupler 93, positioned outside or at the periphery of the laser gain medium 63 and having a coating thereon with a selected reflectivity $r_L$ at the laser wavelength $\lambda_L$. At each of the light beam bounce points 71, 73, 75, 77 and 79, the incidence angles of light emitted by the respective optical fibers 81, 83, 85, 87 and 89 (and 86 and 88, discussed below) are chosen so that light of wavelength $\lambda_P$ issuing from a fiber is received by the surface 65 or 67 at a light beam bounce point and is refracted into the laser gain medium 63. The direction of this refracted light beam approximately coincides with the direction of the laser light beam 91 that propagates within the laser gain medium 63 away from the bounce point along a common path. A laser cavity, having a 4.5 mm length laser gain medium of Nd:YLF and having a cavity light beam diameter of 600 μm, has been operated satisfactorily using this approach, with $\lambda_L = 1.047$ μm and $\lambda_P = 0.798$ μm. The laser gain material absorbed about 80 percent of the incident pump light beam energy. Suitably oriented additional fibers, such as 86 and 88, can be added at each bounce point to emit pump light in the opposite direction along the light beam path, as shown in FIG. 5.

Figure 6:
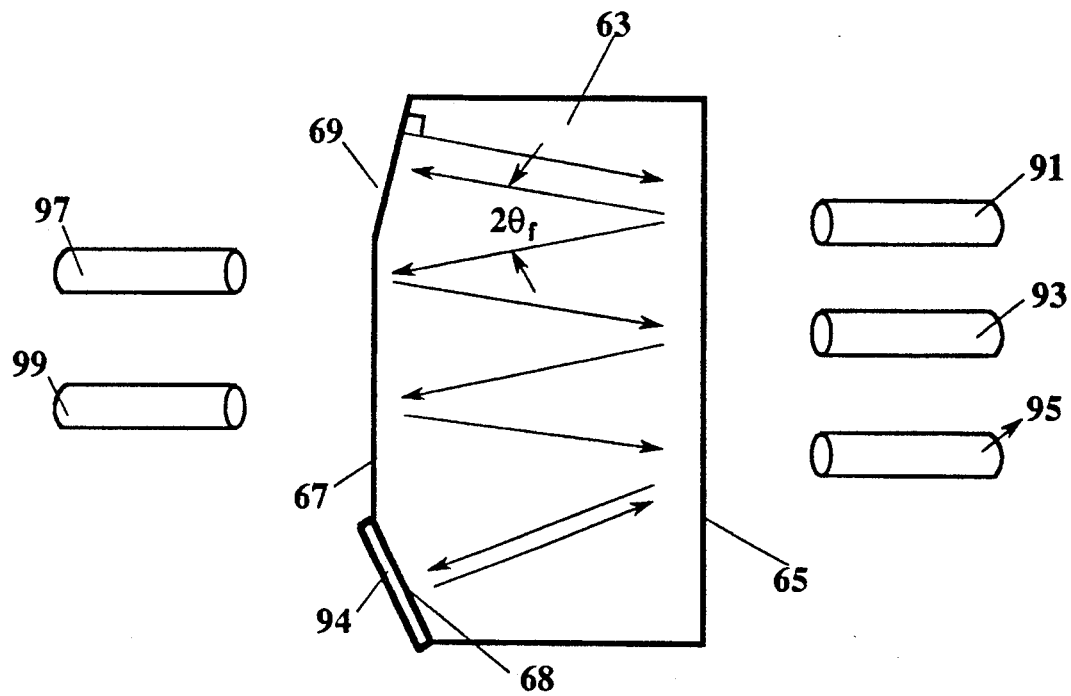

If the fold angle or incidence angle $\theta_f$ of a light beam path within the laser gain material at a bounce point is small enough so that pump light is absorbed before the incident beam and reflected beam diverge very much at the point of reflection, optical fibers 91, 93, 95, 97 and 99 can be oriented approximately perpendicular to the light reflecting surfaces 65 and 67 of the laser gain material 63 to simultaneously pump the laser beam traveling in both the incoming light beam path and the outgoing light beam path at a bounce point, as illustrated in FIG. 6. Optionally, in the embodiments of either FIG. 5 or FIG. 6, the spaced apart light beam output coupler 93 (FIG. 5) may be replaced by a light beam output coupler 94 (FIG. 6) that is contiguous to the surface 68 of the laser gain material 63.

Figure 7:
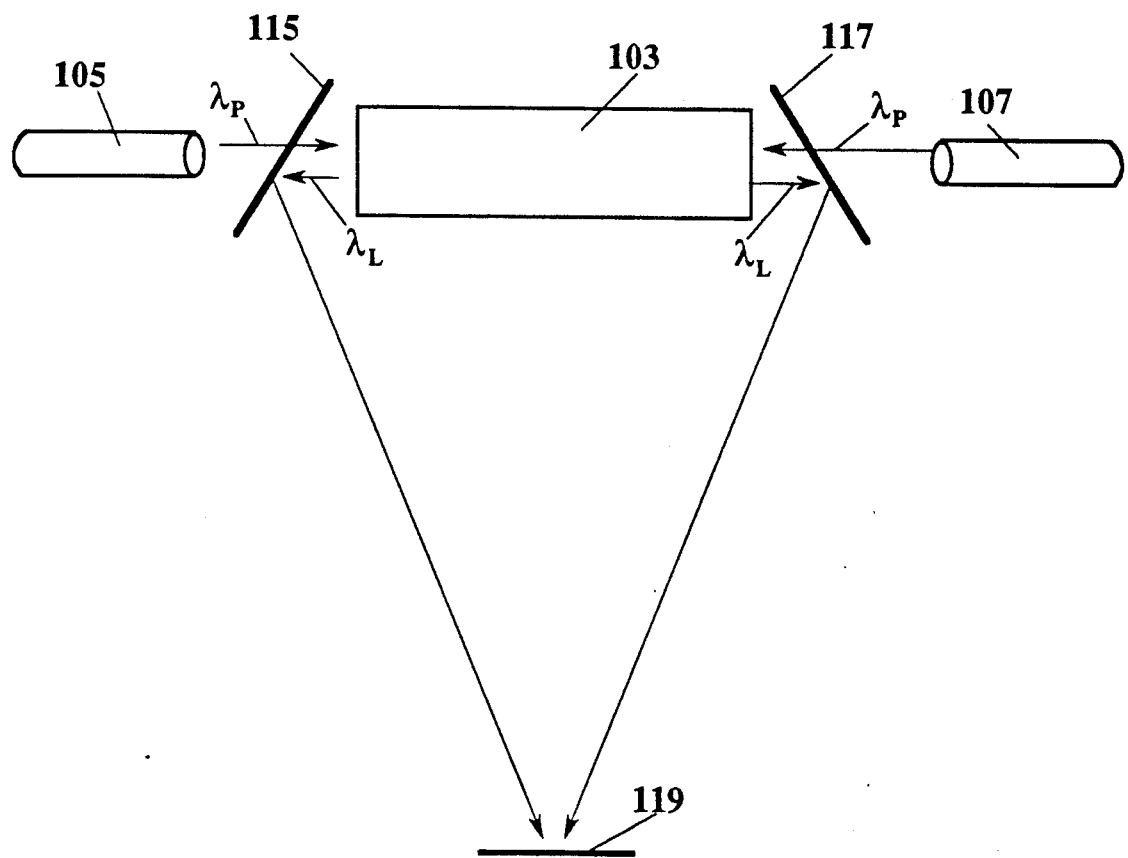
FIG. 7 illustrates an alternative embodiment for end-pumping of a cavity according to the invention.

The laser gain material need not have surfaces with one or more light beam bounce points as points of entry for the light beams issuing from the optical fibers. FIG. 7 illustrates an embodiment 101 in which a laser gain material 103 receives pump light beams of wavelength $\lambda_P$ from two or more optical fibers 105 and 107 for pumping the laser gain material. Light beams of wavelength $\lambda_L$ that issue from the laser gain material 103 are received by mirrors 115 and 117, which are transmitting at wavelength $\lambda_P$ and are highly reflecting at wavelength $\lambda_L$, and are redirected by these mirrors for some desired use. Optionally, one or more third mirrors 119, highly reflecting at wavelength $\lambda_L$, can be positioned so that the mirrors 115, 117 and 119 form a ring cavity, as shown in FIG. 7.

Optical fiber pumping of a laser resonator by use of a diode laser array has the following advantages. First, the difficult task of focusing a rapidly diverging diode output light beam directly into the laser resonator is replaced by two easier tasks, namely focusing this diode output light beam into a plurality of optical fibers at first ends of the fibers and focusing the light beams issuing from second ends of these fibers into the resonator. Second, mechanical design is much more flexible where the diode output light beams are "piped" to the resonator through low loss optical fibers. Third, a plurality of diode lasers can be combined to pump an arbitrarily small laser resonator. Fourth, heat generated by the laser diode array can be separated from the pumped laser resonator so that cooling requirements at the laser resonator are reduced. The configurations illustrated in FIGS. 1–7 thus provide an attractive approach to production and control of light issued by diode lasers for pumping of laser gain media.

We claim:

1. Apparatus for pumping a solid-state laser, the apparatus comprising:

a plurality of M diode laser light sources, numbered $m = 1, 2, \ldots, M$ ($M \geq 2$), each emitting a diverging light beam including a selected wavelength $\lambda_P$, the light sources being spaced apart from one another in a stack, each light source being oriented to emit a pump light beam in the same direction;

a plurality of N cylindrical lenses numbered $n = 1, 2, \ldots, N$ ($N \geq 2$), with cylindrical lens number n receiving a portion of or all of the light of the light beams emitted by a selected group of the light sources and converting these diverging light beams into light beams with reduced beam divergence in a selected direction;

a plurality of K mirrors numbered $k = 1, \ldots, K$, with mirror number k receiving light beams issuing from a selected portion of a cylindrical lens and redirecting these light beams in another direction;

a plurality of K optical fibers numbered $k = 1, \ldots, K$, each fiber having a first end and a second end, with fiber number k being positioned adjacent to mirror number k so that the light beams received by mirror number k are redirected toward that fiber; and light collection optics, positioned to receive the light beams redirected by a mirror and to focus each of these light beams onto the first end of the adjacent optical fiber with a selected light beam spot diameter and with a beam convergence angle whose sine is no greater than the numerical aperture of the fiber, whereby pump light beams emitted by at least K of the light sources are received by and propagated within the K fibers.

2. The apparatus of claim 1, further comprising:

a solid-state optical cavity containing a selected laser gain material that has an absorption band for laser pump radiation that includes said wavelength $\lambda_P$, the cavity including a plurality of at least two reflecting and refracting surfaces, with said optical fiber number k having a second end that optical fibers to be refracted into and to propagate within the optical cavity along a common optical path and to produce laser light within the laser gain material of a selected laser wavelength $\lambda_L$; and a light beam output coupler, positioned to receive a portion of the laser light beam that is transmitted out of the laser gain material at a selected surface, to transmit a selected portion of this received laser light beam and to reflect the remainder of this received laser light beam back toward the selected surface of the laser gain material.

3. The apparatus of claim 2, wherein said light beam that propagates within said laser cavity has a minimum beam diameter D and at least one of said pump light beams emitted from said second end of one of said optical fibers has a beam spot with a diameter d that is no larger than D.

4. The apparatus of claim 3, wherein said beam spot diameter d of said pump beams propagating within said optical fibers is no larger than 300 μm.

5. The apparatus of claim 3, wherein at least one of said reflecting and refracting surfaces of said optical cavity has a dichroic coating thereon that reflects an incident light beam of said wavelength $\lambda_L$ and transmits an incident light beam of said wavelength $\lambda_P$.

6. The apparatus of claim 2, wherein at least two of said reflecting and refracting surfaces of said optical cavity are approximately parallel to each other.

7. The apparatus of claim 2, wherein at least two of said reflecting surfaces of said optical cavity are not parallel to each other.

8. The apparatus of claim 2, wherein said laser gain material is drawn from the class consisting of Nd:YAG, Tm:YAG and Nd:YLF.

9. The apparatus of claim 1, wherein each of said optical fibers has a numerical aperture NA that is no greater than 0.5.

10. The apparatus of claim 9, wherein each of said optical fibers has a numerical aperture NA that lies in the range $0.15 \leq NA \leq 0.3$.

11. The apparatus of claim 1, wherein a group of said light beams passed through at least one selected group of said cylindrical lenses is not received by any of said K mirrors, the apparatus further comprising another optical fiber, numbered $K+1$ and having a first end and a second end, where said light collection optics receives this group of said light beams directly from this selected group of cylindrical lenses and focuses each of these light beams onto a first end of optical fiber number $K+1$.

12. An optical system for coupling a stack of laser diode bars into a plurality of optical fibers, the apparatus comprising:

a plurality of diode laser bars positioned adjacent to one another so that the diode bars, when activated, emit a plurality of diverging light beams including a wavelength $\lambda_P$ in a selected direction;

a plurality of optical fibers, each having a light-receiving end and having an associated numerical aperture;

a plurality of cylindrical lenses, each positioned to receive a portion of or all of the diverging light beams emitted by the diode bars and to emit these light beams with reduced beam divergence relative to a selected direction;

a plurality of mirrors, positioned to receive the light beams issuing from the lenses and to divide these light beams into a plurality of smaller, non-overlapping light beams; and light collection optics to receive a light beam from a mirror and to focus this light beam onto a light-receiving first end of one of the optical fibers with a beam convergence angle whose sine is no greater than the numerical aperture of the fiber that receives this light beam.

13. The apparatus of claim 12, further comprising:

a solid-state optical cavity containing a selected laser gain material that has an absorption band for laser pump radiation that includes said wavelength $\lambda_P$, the cavity including a plurality of at least two reflecting and refracting surfaces, with each of said optical fibers having a second end positioned to emit a pump light beam that is received by one of these reflecting and refracting surfaces at a selected incidence angle, to cause said pump light beam received from any one of said optical fibers to be refracted into and to propagate within the optical cavity along a common optical path and to produce laser light within the laser gain material of a selected laser wavelength $\lambda_L$; and a light beam output coupler, positioned to receive a portion of the laser light beam that is transmitted out of the laser gain material at a selected surface, to transmit a predetermined portion of this received light beam and to reflect the remainder of this received laser light beam back toward the selected surface of the laser gain material.

14. The apparatus of claim 13, wherein said light beam that propagates within said laser cavity has a minimum beam diameter D and at least one of said pump light beams emitted from said second end of one of said optical fibers has a beam spot with a diameter d that is no larger than D.

15. The apparatus of claim 14, wherein said beam spot diameter d of said pump beams propagating within said optical fibers is no larger than 300 μm.

16. The apparatus of claim 14, wherein at least one of said reflecting and refracting surfaces of said optical cavity has a dichroic coating thereon that reflects an incident light beam of said wavelength $\lambda_L$ and transmits an incident light beam of said wavelength $\lambda_P$.

17. The apparatus of claim 13, wherein at least two of said reflecting and refracting surfaces of said optical cavity are approximately parallel to each other.

18. The apparatus of claim 13, wherein two of reflecting and refracting surfaces of said optical cavity are not parallel to each other.

19. The apparatus of claim 13, wherein said laser gain material is drawn from the class consisting of Nd:YAG, Tm:YAG and Nd:YLF.

20. The apparatus of claim 12, wherein each of said optical fibers has a numerical aperture NA that is no greater than 0.5.

21. The apparatus of claim 20, wherein each of said optical fibers has a numerical aperture NA that lies in the range $0.15 \leq NA \leq 0.3$.

22. The apparatus of claim 12, wherein a group of said light beams passed through at least one selected group of said cylindrical lenses is not received by any of said mirrors, the apparatus further comprising an additional optical fiber, having a first end and a second end, where said light collection optics receives said light beams directly from this selected group of cylindrical lenses and focuses each of these light beams onto a first end of the additional optical fiber.

23. An optical system for coupling a stack of laser diode bars into a plurality of optical fibers, the apparatus comprising:

a plurality of diode laser bars positioned adjacent to one another in a two-dimensional array so that each bar, when activated, emits a diverging light beam that diverges by a first angle approximately $\theta_1$, measured in a first direction, and diverges by a second angle approximately $\theta_2$, measured in a second direction perpendicular to the first direction, where $\theta_2 << \theta_1$, each diverging light beam being emitted in a selected third direction;

a plurality of optical fibers, each having a light-receiving end and having an associated numerical aperture at the light-receiving end;

a plurality of cylindrical lenses positioned to receive the diverging light beams emitted by the diode bars and to reduce the beam divergence of these light beams in the first direction so that the beam divergence angle $\theta_3$ measured in the first direction of a light beam issuing from a cylindrical lens becomes comparable to the second angle $\theta_2$;

a plurality of mirrors, positioned to receive the focused light beams issuing from the lenses, to divide this light beam into a plurality of smaller, non-overlapping light beams; and light collection optics to receive at least one such smaller light beam from the mirrors and to focus each smaller light beam received onto a light-receiving end of an optical fiber with a beam convergence angle whose sine is no greater than the numerical aperture of the fiber that receives this smaller light beam.

24. The apparatus of claim 23, wherein said angle $\theta_2$ lies in the range $0° < \theta_2 < 10°$ and said angle $\theta_1$ is at least 20°.

* * * * *